(12) United States Patent
Wu et al.

(10) Patent No.: US 11,910,571 B2
(45) Date of Patent: Feb. 20, 2024

(54) HOUSING PARTS, HOUSINGS AND PROCESSES FOR PREPARING THE SAME

(71) Applicant: COVESTRO INTELLECTUAL PROPERTY GMBH & CO. KG, Leverkusen (DE)

(72) Inventors: Guanghui Wu, Shanghai (CN); Fan Yang, Shanghai (CN); Ke Hong, Shanghai (CN)

(73) Assignee: Covestro Intellectual Property GmbH & Co. KG, Leverkusen (DE)

(*) Notice: Subject to any disclaimer, the term of this patent is extended or adjusted under 35 U.S.C. 154(b) by 214 days.

(21) Appl. No.: 17/626,400

(22) PCT Filed: Jul. 13, 2020

(86) PCT No.: PCT/EP2020/069718
§ 371 (c)(1),
(2) Date: Jan. 11, 2022

(87) PCT Pub. No.: WO2021/009103
PCT Pub. Date: Jan. 21, 2021

(65) Prior Publication Data
US 2022/0264762 A1 Aug. 18, 2022

(30) Foreign Application Priority Data

Jul. 15, 2019 (WO) ............... PCT/CN2019/095963
Aug. 15, 2019 (EP) ..................................... 19191877

(51) Int. Cl.
*H05K 7/20* (2006.01)
*B29C 45/00* (2006.01)
(Continued)

(52) U.S. Cl.
CPC ....... *H05K 7/2039* (2013.01); *B29C 45/0001* (2013.01); *B29C 45/16* (2013.01);
(Continued)

(58) Field of Classification Search
CPC .................................................. H05K 7/2039
See application file for complete search history.

(56) References Cited

U.S. PATENT DOCUMENTS

| 1,137,373 A | 4/1915 | Aylsworth |
| 1,191,383 A | 7/1916 | Aylsworth |

(Continued)

OTHER PUBLICATIONS

International Search Report for PCT/EP2020/069718 dated Sep. 9, 2020 by Niaounakis Michael.

*Primary Examiner* — Adrian S Wilson
(74) *Attorney, Agent, or Firm* — John E. Mrozinski, Jr.

(57) ABSTRACT

The present invention relates to a housing part, a housing and an electronic device. The housing part according to this invention comprises a first layer, said first layer being molded from a first composition comprising a1) 50-90 wt. % of a first amorphous polymer and b1) 10-50 wt. % of a first thermally conductive filler, the first composition having a thermal conductivity (TC1) of 4-40 W/(m*K), a second layer, said second layer being molded from a second composition comprising a2) 50-90 wt. % of a second amorphous polymer and b2) 10-50 wt. % of a second thermally conductive filler, the second composition having a thermal conductivity (TC2) of 0.5-10 W/(m*K), and the second layer being molded over the first layer by leaving at least one area of the first layer not being over-molded with the second layer for being exposed to at least one heat source, wherein, TC1 is at least 2 W/(m*K) larger than TC2, the amounts of a1 and b1 are based on the total weight of the first composition, the amounts of a2 and b2 are based on the total weight of the second composition, and the thermal conductivity is measured in-plane according to ASTM E1461-01. The housing part provided in this invention has high heat dissipating efficiency and mechanical properties as well as high dimensional stability.

12 Claims, 2 Drawing Sheets

(51) Int. Cl.
*B29C 45/16* (2006.01)
*C08L 69/00* (2006.01)
B29K 69/00 (2006.01)
B29L 31/18 (2006.01)

(52) U.S. Cl.
CPC .......... *C08L 69/00* (2013.01); *B29K 2069/00* (2013.01); *B29K 2995/0013* (2013.01); *B29L 2031/18* (2013.01); *C08L 2205/02* (2013.01); *C08L 2207/04* (2013.01); *C08L 2666/70* (2013.01)

(56) References Cited

U.S. PATENT DOCUMENTS

| | | | |
|---|---|---|---|
| 3,404,061 | A | 10/1968 | Shane et al. |
| 5,114,791 | A * | 5/1992 | Stahlke ............... B29C 45/1642 428/419 |
| 8,372,495 | B2 | 2/2013 | Kenney |
| 11,466,130 | B2 * | 10/2022 | Grinsteinner ............. C08J 5/10 |
| 2013/0216799 | A1 | 8/2013 | Van Dijk et al. |
| 2017/0203551 | A1 | 7/2017 | Davis et al. |
| 2017/0217063 | A1 * | 8/2017 | Van Dijk ................ B32B 7/027 |
| 2019/0283381 | A1 | 9/2019 | Rousseaux et al. |
| 2020/0001508 | A1 * | 1/2020 | Lorenzo ................. B29C 45/16 |
| 2023/0167261 | A1 * | 6/2023 | Meng ..................... B29C 44/14 521/82 |

* cited by examiner

HOUSING PARTS, HOUSINGS AND PROCESSES FOR PREPARING THE SAME

CROSS REFERENCE TO RELATED APPLICATIONS

This application is a national stage application under 35 U.S.C. § 371 of PCT/EP2020/069718, filed Jul. 13, 2020, which claims benefit of European Application No. 19191877.0, filed Aug. 15, 2019 and PCT/CN2019/095963, filed Jul. 15, 2019, all of which are incorporated herein by reference in their entireties.

TECHNICAL FIELD

The present invention relates to housing parts and housings used in electronic devices, in particular to housing parts molded from polycarbonate compositions, as well as to processes for preparing the same.

BACKGROUND ART

In electronic industry, electronic devices are more and more compacted, which means more and more electronic components are integrated into smaller and smaller housings. Housings are necessary for protecting electronic components integrated inside electronic devices. Usually these electronic components generate high volume of heat when they work. Therefore, one of the challenges in preparing such housings is to ensure the heat generated by electronic components being dissipated efficiently to avoid overheating.

US 20130216799 A1 discloses an assembly of parts comprising a first part containing a first polymer composition and a second part containing a second polymer composition, both compositions comprising a semi-crystalline polymer and optionally one or more other components, the first part and the second part being fastened to each other through an interface between the first polymer composition and the second polymer composition, wherein the interface is free from mechanically interlocking elements and the thermal conductivity of the second polymer composition (TC2) is higher than the thermal conductivity of the first polymer composition (TC1) with a factor TC2/TC1 of at least 1.5.

U.S. Pat. No. 5,114,791 A discloses two-component injection molded articles in which polyarylene sulfides (PAS), preferably polyphenylene sulfide (PPS), are present as at least one component and a process for their production, and that PAS may be amorphous and (partially) crystalline and used in filled and unfilled form. Highly filled (partially) crystalline polyarylene sulfides are preferably used for the core. In addition to polyarylene sulfides, (partially) crystalline and amorphous thermoplasts may be used as a further component.

In WO 2018/164666 A1, two shot injection molding processes are disclosed for making thermoplastic parts of two different compositions, the second shot composition having a higher thermal conductivity than the first, and the mold cavity surface temperature is greater than 70° C., preferably 70-100° C. In WO 2018/164666 A1, the second polymer comprises at least one semi-crystalline thermoplastic at an amount ranging from 90-30 wt. % of the composition of the second polymer.

U.S. Pat. No. 8,372,495 B2 discloses a housing for an electronic device or other object formed in a layered configuration. The case/housing may have a first layer and a second layer formed from a first material. The case may also include a core formed from a second material. Where the first layer may be bonded to a top surface of the core and the second layer may be bonded to a bottom surface of the core.

US 2017/0203551 A1 discloses a housing for an electronic device comprising: a solid core layer comprising a first thermoplastic material; a first skin layer comprising a second thermoplastic material located on a first side of the core layer; a second skin layer comprising the second thermoplastic material located on a second side of the core layer opposite the first side; wherein the core layer has a through plane thermal conductivity of greater than equal to 0.1 W/mK; and wherein the thickness of the core layer is 30% to 75% of the total thickness of the housing.

For high power electronic devices, industrial needs exist in the art for new housing parts and housings with high mechanical properties, high heat dissipating efficiency and high dimensional stability.

SUMMARY OF THE INVENTION

One object of the present invention is to provide a housing part preferably meeting the above mentioned needs. The housing part according to this invention comprises a first layer, said first layer being molded from a first composition comprising a1) 50-90 wt. % of a first amorphous polymer and b1) 10-50 wt. % of a first thermally conductive filler, the first composition having a thermal conductivity (TC1) of 4-40 W/(m*K), a second layer, said second layer being molded from a second composition comprising a2) 50-90 wt. % of a second amorphous polymer and b2) 10-50 wt. % of a second thermally conductive filler, the second composition having a thermal conductivity (TC2) of 0.5-10 W/(m*K), the second layer being molded over the first layer by leaving at least one area of the first layer not being over-molded with the second layer for being exposed to at least one heat source, wherein, TC1 is at least 2 W/(m*K) larger than TC2, the amounts of a1 and b1 are based on the total weight of the first composition, the amounts of a2 and b2 are based on the total weight of the second composition, and the thermal conductivity is measured in-plane according to ASTM E1461-01.

Another object of the present invention is to provide a process for preparing the housing part according to the invention preferably meeting the above mentioned needs. The process comprises the steps of: molding the first layer with the first composition in a first mold cavity, and molding the second layer with the second composition in a second mold cavity over the first layer by leaving at least one area of the first layer not being over-molded with the second layer for being exposed to at least one heat source.

Another object of the present invention is to provide a housing preferably meeting the above mentioned needs. The housing comprises a housing part according to this invention. In the housing, the housing part according to the invention is preferably used as a bottom part of the housing and correspondingly the housing preferably further comprises a covering part, and the covering part is made from any suitable material, and preferably is made from a thermoplastic polymer, and alternatively it can be a housing part according to this invention.

Another object of the present invention is to provide an electronic device preferably meeting the above mentioned needs. The electronic device comprises a housing, the housing comprising a housing part according to this invention and the electronic device further comprises at least one electronic component mounted in the housing, the electronic component generating heat when working.

Preferably the first amorphous polymer contained in the first composition and the second amorphous polymer contained in the second composition are the same. Preferably the first amorphous polymer and/or the second amorphous polymer are a polycarbonate, more preferably an aromatic polycarbonate.

Preferably, each of the first composition and the second composition comprises independently less than 5 wt. %, more preferably less than 3 wt. %, further more preferably less than 1 wt. % of, and most preferably no a semi-crystalline polymer or a crystalline polymer, based on the total weight of the first composition and/or the second composition respectively.

The thermally conductive fillers contained in the first composition and the second composition can be the same or different. Preferably, at least 50 wt. % of b1) is selected from the group consisting of a silicon nitride, an aluminium nitride, a boron nitride, a graphite, a ceramic filler and any mixture thereof, and more preferably selected from the group consisting of a graphite and a ceramic filler, based on the total weight of b1).

Preferably, at least 50 wt. % of b2) is selected from the group consisting of a magnesium hydroxide, a talc, a boehmite aluminum hydroxide, a diaspore aluminum hydroxide, a gibbsite aluminum hydroxide, a calcium carbonate, a mica, a barium oxide, a barium sulfate, a calcium silicate, a zirconium oxide, a silicon oxide, a glass beads, a magnesium aluminum oxide, a calcium magnesium carbonate, a ceramic coated graphite, a clay, and any mixture thereof, and more preferably is a talc, based on the total weight of b1).

Preferably, the at least one electronic component in the electronic device generates heat as the at least one heat source when working.

Preferably, the area of the first layer not being over-molded with the second layer comprises at least one heat sink and the heat sink is preferably coupled with the at least one heat source. Preferably the heat sink comprises at least one fin. The heat source can be an electronic component, such as electronic chips. The heat sink is preferably coupled with the heat source through a thermal interface material.

The housing parts according to the invention comprise two layers molded from different compositions comprising amorphous polymers and thermal conductivities. The first layer having comparatively higher thermal conductivity is exposed to the heat sources and dissipates heats with high efficiency from heat sources to the second layer having a comparative lower thermal conductivity, and such second layer dissipates the heat to the environment and also contributes high dimensional stability and good mechanical properties. The first composition containing the first amorphous polymer is well fastened with the second composition containing the second amorphous polymer at their interface. The solution according to this invention ensures the housing part a high heat dissipating efficiency, good dimensional stability and mechanical properties.

BRIEF DESCRIPTION OF THE FIGURES

The use of the same reference numerals in different drawings indicates similar or identical items.

DETAILED DESCRIPTION OF THE INVENTION

Figure 1:
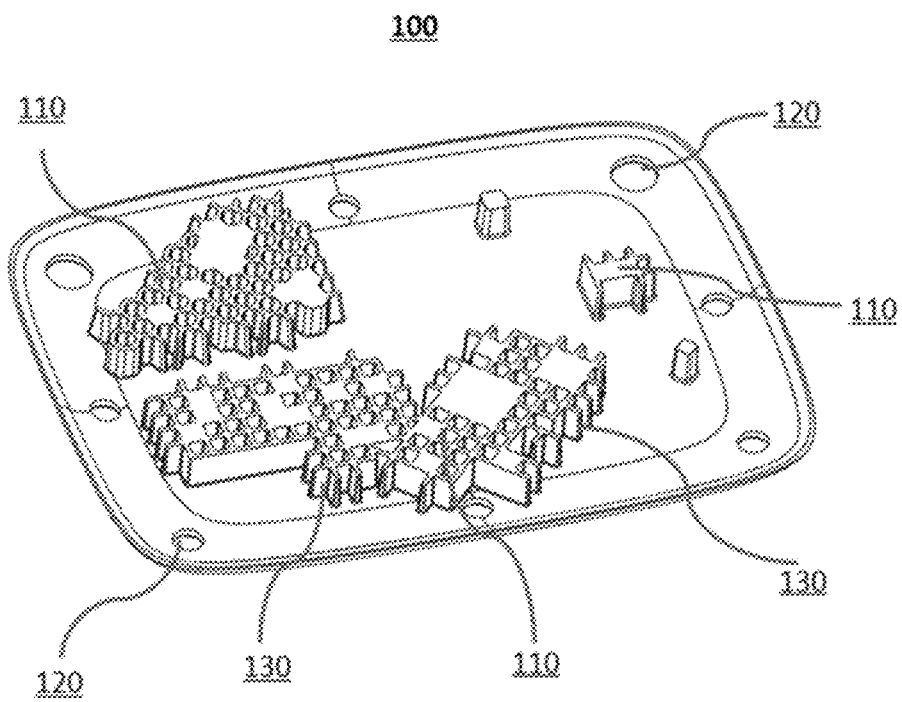
FIG. 1 illustrates one embodiment of a first layer of a housing part prepared according to this invention.

The present invention is now described for the purpose of illustration rather than limitation.

Housing Part

The housing part according to this invention comprises a first layer, said first layer being molded from a first composition comprising a1) 50-90 wt. %, preferably 60-80 wt. %, more preferably 60-70 wt. % of a first amorphous polymer and b1) 10-50 wt. %, preferably 20-40 wt. %, more preferably 30-40 wt. % of a first thermally conductive filler, the first composition having a thermal conductivity (TC1) of 4-40 W/(m*K), preferably 4.5-30 W/(m*K), more preferably 5-20 W/(m*K), most preferably 6-18 W/(m*K), a second layer, said second layer being molded from a second composition comprising a2) 50-90 wt. %, preferably 50-80 wt. %, more preferably 55-80 wt. % of a second amorphous polymer and b2) 10-50 wt. %, preferably 20-50 wt. %, more preferably 20-45 wt. % of a second thermally conductive filler, the second composition having a thermal conductivity (TC2) of 0.5-10 W/(m*K), preferably 0.6-8 W/(m*K), more preferably 0.8-5 W/(m*K), most preferably 1-4 W/(m*K), the second layer being molded over the first layer by leaving at least one area of the first layer not being over-molded with the second layer for being exposed to at least one heat source, wherein, TC1 is at least 2 W/(m*K), preferably at least 3 W/(m*K) larger than TC2, the amounts of a1 and b1 are based on the total weight of the first composition, the amounts of a2 and b2 are based on the total weight of the second composition, and the thermal conductivity is measured in-plane according to ASTM E1461-01.

Both the first composition and the second composition of the housing part according to the invention comprise an amorphous polymer and a thermally conductive filler, and preferably further comprise one or more additives.

Both the first amorphous polymer and the second amorphous polymer are independently preferably an amorphous polycarbonate, more preferably an aromatic polycarbonate, and/or an amorphous polyester, as well as their copolymers and blends thereof. The term "polycarbonate" is to be understood as meaning both homopolycarbonates and copolycarbonates.

The first amorphous polymer and the second amorphous polymer are preferably the same, by which the interfacial adhesive energies between the first layer and the second layer can be enhanced. The first amorphous polymer and the second amorphous polymer can also be different in a specific application for reasons, such as cost, mechanical property, heating release, electronic or magnetic effects. Preferably the first amorphous polymer and the second amorphous polymer are independently a polycarbonate, more preferably an aromatic polycarbonate.

Preferably, each of the first composition and the second composition comprises independently less than 5 wt. %, more preferably less than 3 wt. %, in particular more preferably less than 1 wt. % of, and most preferably no a semi-crystalline polymer or a crystalline polymer, based on the total weight of the first composition and/or the second composition respectively.

The first thermally conductive filler and the second thermally conductive filler according to this invention are any materials that can be dispersed in the first composition and the second composition respectively improve the thermal conductivities of the corresponding compositions.

Preferably at least 50 wt. %, preferably at least 60 wt. %, more preferably at least 80 wt. % of the first thermally conductive filler is selected from the group consisting of a silicon nitride, an aluminium nitride, a boron nitride, a graphite, a ceramic filler and any mixture thereof, and more preferably selected from the group consisting of a graphite, in particular an expanded graphite, and a ceramic filler, based on the total weight of the first thermally conductive filler.

The graphite is preferably used in the form of fibers, rods, beads, hollow beads, platelets and/or powders, in each case either in aggregated or agglomerated form, preferably in platelet form in the preparation of the first composition.

The platelet form of the graphite according to the invention refers to a particle which has a flat geometry. Such particles may in turn have undergone aggregation or agglomeration to form structures. Accordingly, the height of such particles is less than 500 nm, preferably less than 200 nm, and more preferably less than 100 nm, and is typically much smaller compared to the width or length of the particles. The shape of such particles may be bent, curved, corrugated or otherwise deformed. The length dimensions of the particles may be determined by standard methods, such as by electron microscopy.

The graphite preferably has a particle size distribution, characterized by the D (0.9), of at least 1 mm, preferably of at least 1.2 mm, more preferably of at least 1.4 mm and more preferably still of at least 1.5 mm. Likewise preferably, the graphite has a particle size distribution, characterized by the D (0.5), of at least 400 µm, preferably of at least 600 µm, more preferably of at least 750 µm and more preferably still of at least 850 µm. Likewise preferably, the graphite preferably has a particle size distribution, characterized by the D (0.1), of at least 100 µm, preferably of at least 150 µm, more preferably of at least 200 µm and more preferably still of at least 250 µm. The characteristic numbers D(0.1), D(0.5) and D(0.9) are determined by sieve analysis in accordance with DIN 51938.

The graphite preferably has a density, determined using xylene, in the range from 2.0 g/cm$^3$ to 2.4 g/cm$^3$, preferably from 2.1 g/cm$^3$ to 2.3 g/cm$^3$, and more preferably from 2.2 25 g/cm$^3$ to 2.27 g/cm$^3$.

Preferably, the graphite prior to processing has a thermal conductivity in the range of 250~400 W/(m*K) parallel to the basal planes and in the range of 6~8 W/(m*K) perpendicular to the basal planes measured according to ASTM E1461-01.

Preferably, the graphite prior to processing has an electrical resistor of about 0.001 Ω*cm parallel to the basal planes and less than 0.1 Ω*cm perpendicular to the basal planes.

Commercially available graphites are, among others, Ecophit® GFG 5, Ecophit® GM 50, Ecophit® GFG 200, Ecophit® GFG 350, Ecophit® GFG 500, Ecophit® GFG 900, Ecophit® GFG 1200 from SGL Carbon GmbH, TIMREX® BNB9O, TIMREX® KS5-44, TIMREX® KS6, TIM-REX® KS150, TIMREX® SFG44, TIMREX® SFG150, TIMREX® C-THERM' 001 and TIMREX®C-THERM™ 011 from TIMCAL Ltd., SC 20 O, SC 4000 O/SM and SC 8000 O/SM from Graphit Kropfmühl AG, Mechano-Cond 1, Mechano-Lube 2 and Mechano-Lube 4G from H.C. Carbon GmbH, Nord-Min 251 and Nord-Min 560T from Nordmann Rassmann GmbH and ASBURYA99, Asbury 230U and Asbury 3806 from Asbury Carbons.

The expanded graphite according to this invention has individual basal planes driven apart by a specific treatment, which results in an increase in volume of the graphite, preferably by a factor of 200 to 400. The production of expanded graphites is described inter alia in documents U.S. Pat. Nos. 1,137,373 A, 1,191,383 A and 3,404,061 A. The expanded graphite according to the invention has preferably a relatively high specific surface area determined as the BET surface area by means of nitrogen adsorption as per ASTM D3037, for example, the BET surface area is of ≥5 m$^2$/g, preferably ≥10 m$^2$/g and more preferably ≥18 m$^2$/g.

The area of the first layer not being over-molded with the second layer is for being exposed to at least one heat source. The heat source can be electronic chips or other electronic components, such as electronic resistors, which generate heat when they are working.

Preferably the area of the first layer not being over-molded with the second layer comprises at least one heat sink, and such heat sink further preferably comprises at least one fin. Such heat sink and fin are at the side of the first layer opposite to the other side of the first layer over molded with the second layer. Preferably at least one of such heat sources is coupled with at least one of the heat sinks through such as a thermal interface material.

It is preferable that the first layer made from the first composition has a thickness of at least 1.5 mm, more preferably at least 2 mm. When there is preferably at least one heat sink in the area of the first layer not being over-molded with the second layer, the height of such heat sink is calculated separately from the thickness of the first layer.

The term of thermal conductivity (TC) according to the invention means the in-plane thermal conductivity in the direction of the maximum in plane conductivity. In this invention, the TC of a composition is measured as the follows: 1) the composition samples for measuring is of 80 mm×80 mm×2 mm and is prepared with an injection molding machine, which is equipped with a square mold with the proper dimensions and a film gate of 80 mm wide and 1 mm high positioned at one side of the square, and 2) the thermal diffusivity (α) in a direction in-plane and parallel to the injection molding direction, the density (ρ) and the heat capacity ($C_p$) are determined. The thermal diffusivity (α, cm$^2$/s) in a direction in-plane and parallel to the injection molding direction is determined according to the ASTM E1461-01 using a Nanoflash LFA 447 xenon flash apparatus (Netzsch Group). 3) The heat capacity ($C_p$) of the composition samples for measuring is determined by comparison to a reference sample with a known heat capacity (Pyroceram 9606), using the same Nanoflash LFA 447 xenon flash apparatus and employing the procedure described by W. Nunes dos Santos, P. Mummery and A. Wallwork, Polymer Testing 14 (2005), 628-634. Density was determined using a water immersion method (ASTM D792). 4) The product of three values (α, ρ, and $C_p$) gives the thermal conductivity in the through plane according to the following Formula (1):

$$TC = \alpha \times \rho \times C_p \qquad \text{Formula (1)}$$

All values for any TC mentioned in this invention are measured at 20° C. and expressed in W/(m*K).

The second thermally conductive filler has a TC of 0.5-10 W/(m*K). Preferably, at least 50 wt. %, preferably 60 wt. %, more preferably 80 wt. % of the second thermally conductive filler is selected from the group consisting of magnesium hydroxide (Mg(OH)$_2$), talc (H$_2$Mg$_3$(SiO$_3$)$_4$), boehmite aluminum hydroxide (γ-AlO(OH)), diaspore aluminum hydroxide (α-AlO(OH)), gibbsite aluminum hydroxide (Al (OH)$_3$), calcium carbonate (CaCO$_3$), mica, barium oxide (BaO), barium sulfate (BaSO$_4$), calcium silicate (CaSiO$_3$), zirconium oxide (ZrO$_2$), silicon oxide (SiO$_2$), glass beads, magnesium aluminum oxide (MgO.xAl$_2$O$_3$), calcium magnesium carbonate CaMg(CO$_3$)$_2$, ceramic-coated graphite, clay, and any mixture thereof, and more preferably is a talc, based on the total weight of the second thermally conductive filler.

The second thermally conductive filler is preferably present in particulate or fibrous form. In case that the second thermally conductive filler is in particulate form, the maximum average particle size of the second thermally conductive filler is preferably less than 300 micrometers (μm), and more preferably less than 200 μm, measured with an Accu-Sizer Model 780A (Particle Sizing Systems, Santa Barbara, Calif.) according to laser-diffraction type particle diameter distribution with a Selas Granulometer "model 920" or a laser-diffraction scattering method particle diameter distribution measuring device "LS-230" produced by Coulter K. K., for instance. Preferably, the average particle size is between 1 μm to 100 μm, and more preferably, between 5 μm to 60 μm. The second thermally conductive filler in particles or granules forms which have multi-modal size distribution can also be used according to the invention.

The second thermally conductive filler comprises preferably a talc which has different particle sizes, and more preferably a talc with an average particle size ranging from 1 to 500 micrometer (μm), as determined by sieve analysis in accordance with DIN 51938. The average particle size indicated here means the average size at any of their dimensions of single talc crystals or agglomerate of single crystals.

The surfaces of both the first thermally conductive filler and the second thermally conductive filler can be processed with a coupling agent, for improving the interfacial bonding between them and their corresponding amorphous polymers. Examples of the coupling agent include silane series, titanate series, zirconate series, aluminate series, and zircoaluminate series coupling agents. Useful coupling agents include metal hydroxides and alkoxides including those of Group Ma thru VIIIa, Ib, IIb, Mb, and IVb of the Periodic Table and the lanthanides. Specific coupling agents are metal hydroxides and alkoxides of metals selected from the group consisting of Ti, Zr, Mn, Fe, Co, Ni, Cu, Zn, Al, and B.

Each of the first composition and the second composition preferably comprises one or more additives. Additives according to this invention can be any of the additives known for their function in preparing thermoplastic molding compositions in the industry other than the thermally conductive fillers mentioned above. These include any one or more of lubricants, mold release agents, for example pentaerythritol tetra-stearate, antistatic agents, antioxidants, thermal stabilizers, hydrolytic stabilizers, impact modifiers, reinforcing agents, colorants or pigments, as well as flame retarding agents, drip suppressants or a flame retarding synergists. The additives can be used in effective amounts, according to the common knowledge in the industry, preferably in total of from 0.01 to 30 wt. % relative to the total weight of the corresponding composition.

The first composition and the second composition for preparing the housing parts according to this invention can be obtained by dispersing the respective thermally conductive fillers as well as other components, such as additives in the respective amorphous polymers, said thermally conductive filler being in a concentration to provide the composition with required thermal conductivity.

Housing

The housing comprises a housing part according to this invention. Preferably the housing part according to this invention serves as the bottom part of the housing and correspondingly the housing further comprises a covering part. The covering part can be made from any suitable materials, preferably for example polycarbonate, in particular aromatic polycarbonate, ABS or aromatic polycarbonate/ABS blend.

Electronic Device

The electronic device according to this invention comprises a housing according to this invention and at least one heat source, that is, an electronic component, such as an electronic chip or an electronic resistor, mounted in the housing. Such electronic component generates heat when working, and at least one part of the area of the first layer not being over-molded with the second layer exposes to such electronic components and receives and transmits such heat to the second layer of the housing, and then the second layer transmits the heat to the environments.

Preferably, if the first layer has a heat sink at the area not being over-molded with the second layer, such electronic component is coupled with this heat sink, for example, by a thermal interface material. More preferably, if the heat sink comprises at least one fin which increases the heat dissipating efficiency.

Preferred electronic devices according to this invention are network routers, wireless access point apparatus, power tools, automotive multimedia displays or players and the like.

Electronic components of electronic devices, such as electronic chips, can be mounted inside the space formed by, among others if any, the covering part and the housing part according to the invention.

Processes for Preparing Housing Parts

The process for preparing the housing part according to the invention comprises the steps of: molding the first layer with the first composition in a first mold cavity, and molding the second layer with the second composition in a second mold cavity over the first layer by leaving at least one area of the first layer not being over-molded with the second layer for being exposed to at least one heat source.

The housing part is preferably prepared with an injection molding machine with one injection unit and two mold each of which has one cavity, or one mold having two cavities, a first cavity for molding the first layer while a second cavity for molding the second layer. Accordingly, the housing part is preferably prepared according to the following steps: molding the first layer with the first composition in the first cavity, transferring the first layer into the second cavity, and over-molding the second layer with the second composition over the first layer in the second cavity by leaving at least one area of the first layer not being over-molded with the second layer for being exposed to at least one heat source.

In the process for preparing the housing part according to the invention, the temperature for melting the first composition is in the range of 260~330° C., preferably 270~320° C., more preferably 280~310° C., and the temperature for melting the second composition is in the range of 260~320° C., preferably 270~310° C., and more preferably 280~300° C.

In the process for preparing the housing part according to the invention, the mold cavity surface temperature for molding the first layer is in the range of 60~90° C., preferably 65~85° C., more preferably 70~85° C. and the mold cavity surface temperature for molding the second layer is in the range of 80~130° C., preferably 85~125° C., and more preferably 90~120° C.

FIGURES

With reference to the examples below, the present invention will be described in detail. These examples are only for the purpose of illustration, instead of intending to limit the scope of the present invention.

FIG. 1 illustrates one example of the first layer of the housing part prepared according to this invention.

As shown in FIG. 1, the layer 100 is the first layer of a housing part according to the invention, which was molded from the first composition. The layer 100 comprises the heat sinks 110. The heat sinks 110 are protrusions of the first layer 100. The heat sinks 100 are for coupled with electronic components which generate heat when working. The heat sinks 110 further comprise fins 130. The heat sinks 110 and the fins 130 were designed and molded for collecting, transferring and dissipating heats more efficiently.

Figure 2:
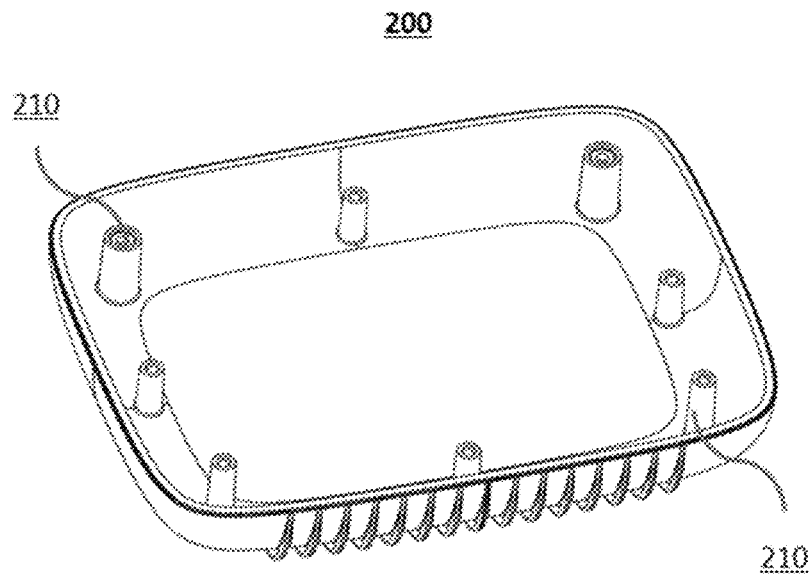
FIG. 2 illustrates one embodiment of a second layer of a housing part prepared according to this invention.

Elements 120 are holes to be coupled with corresponding elements in the second layer of the housing part (e.g., the pole elements 210 as shown in FIG. 2) for further fastening the first layer and the second layer together of the housing part.

FIG. 2 illustrates one example of the second layer 200 of a housing part prepared according to this invention.

As shown in FIG. 2, the pole structure elements 210 are for being coupled with a corresponding element in the first layer of the housing part (e.g., the elements 120 as shown in FIG. 1) for fastening the first layer and the second layer together.

Figure 3:
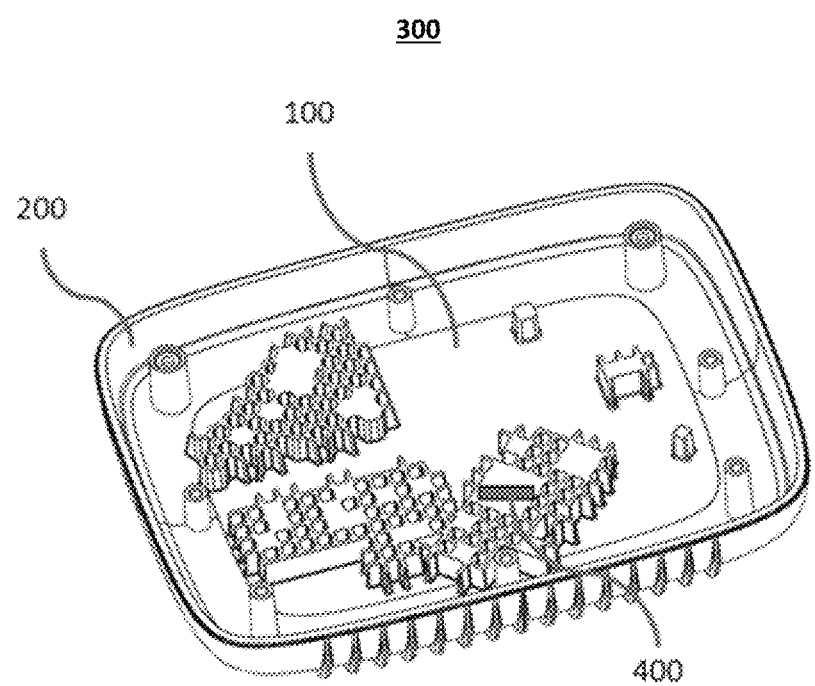
FIG. 3 illustrates one embodiment of a housing part prepared according to this invention.

FIG. 3 illustrates one example of a housing part 300 prepared according to this invention.

The housing part 300 is an assembly of the first layer 100 and the second layer 200. In the preparation of the housing part 300, the first layer 100 was first molded in a first injection mold cavity, and then the first layer 100 was transferred to a second injection mold cavity, in which the second layer 200 was molded. As shown in FIG. 3, the second layer 200 was mould on one side of the first layer 100 but leaving the other side of the first layer 100 not over-moulded with the second composition, which has the heat sinks and fins. When the second layer 200 was molded, the pole elements 210 were molded and coupled with the elements 120 of the first layer 100.

Examples

The housing part shown in FIG. 3 was made from different compositions and tested as examples according to the invention.

Raw Material Used in the Examples

For preparing samples for the inventive examples and comparative examples, different combinations of materials were selected from the materials listed below.

| Seq. | Compositions | source |
| --- | --- | --- |
| Composition 1 (C1) | Makrolon ® TC611, with 60-68% of PC and 32-40% of graphite, and having a thermally conductivity of 16.0 W/(m * K) | Covestro Polymers (China) |
| Composition 2 (C2) | Makrolon ® TC8030, with 60-68% of PC and 32-40% of graphite, and having a thermally conductivity of 14.0 W/(m * K) | |
| Composition 3 (C3) | Makrolon ® TC210, with 55-67% of PC and 33-45% of talc, and having a thermally conductivity of 1.5 W/(m * K) | |
| Composition 4 (C4) | Makrolon ® TC110, with 65-76% of PC and 24-35% of talc, and having a thermally conductivity of 1.0 W/(m * K) | |

Machine Used for Preparing the Housing Part:

The housing parts samples were prepared with an injection molding machine having one injection unit and two mold cavities, and the first mold cavity was for molding the first layer while the second mold cavity was for molding the second layer.

The injection molding machine used in the examples was Sumitomo SE 180DU-C450 with clamping force of 180 tons.

Preparation of Housing Parts

The temperature for melting the first composition was 310° C., and the mold cavity surface temperature was 80° C.

After the first layer was molded, the second mold was set up in the injection molding machine, the first layer was relocated in the second mold cavity of the injection molding machine.

The temperature for melting the second composition was 300° C., and the second mold cavity surface temperature was 90° C.

The second layer was molded over the first layer in the second mold cavity by leaving one side of the first layer to be exposed to at least one heat source.

Testing Methods:

1. The drop testing method (unpackaged drop method).

It is tested with six random drops of the housing part samples prepared from a height of 0.75 m. If the first layer and the second layer are separated, the testing result is record as "seperation" which means the cohesion between the first layer and the second layer is weak, otherwise "No" which means the cohesion between the first layer and the second layer is acceptable. If the housing part cracks but not into several parts, the testing result is record as "cracked" and if the housing part cracks into several parts, the testing results is record as "serious cracked" and if the housing part does not crack, the testing result is record as "No" which means the mechanical properties of the housing part is acceptable. Both "cracked" and "serious cracked" means the mechanical properties of the housing part are not acceptable.

2. The heat dissipation performance testing method.

As shown in FIG. 3 of this invention, a 5 W resistor 400 was used as a heat source and the resistor 400 was sticked with a thermal interface material on the top surface of one of the heat sinks 110 of the first layer. Then the housing part was placed at the center (fin downward) with 580 mm above the ground of the chamber (dimension: length 1000 mm, width 700 mm, height 800 mm) at ambient temperature of 23° C. When the resistor 400 was working (the whole electronic circuit was not shown in FIG. 3), the working temperature of the resistor 400 increased gradually and then reached a steady maximum temperature.

In actual industry applications, an acceptable steady maximum working temperature is lower than the lowest tolerable temperature of all the components integrated in the housing. In the examples according to the invention, the testing is for comparing the heat dissipating performance of the housing parts between the comparative examples and the inventive examples.

The testing results of the inventive examples and comparative examples are listed in Table 1.

TABLE 1

Inventive Examples and Comparative Examples

| Examples | the first layer prepared from the first composition | the second layer prepared from second composition | heat dissipation performance testing | Drop testing Crack? | Separation? |
|---|---|---|---|---|---|
| Inventive example 1 | C1 | C3 | 69.7° C. | No | No |
| Inventive example 2 | C2 | C3 | 72.9° C. | No | No |
| Inventive example 3 | C1 | C4 | 71.6° C. | No | No |
| Inventive example 4 | C2 | C4 | 73.7° C. | No | No |
| Comparative example 1 | C4 | C4 | 126.2° C. | No | No |
| Comparative example 2 | C1 | C1 | 56.6° C. | serious cracked | No |

Housing parts samples prepared in all inventive examples 1, 2, 3 and 4 have shown good heat dissipation performance as in Table 1 with respective steady maximum working temperatures lower than 75° C. and good cohesion between the first layer and the second layer as shown with no crack or separations testing results. Besides that, the second layer prepared with the second composition has improved mechanical strength and surface quality such as high dimensional stability.

In comparative example 1, both the first layer and the second layer were prepared with the composition C4 which had a relatively low thermal conductivity of 1.0 W/(m*K) and this means the difference between TC1 and TC2 is zero. Consequently, the housing part in comparative 1 showed a bad heat dissipation performance as indicated by the steady maximum working temperature of 126.2° C. in Table 1.

In comparative example 2, both the first layer and the second layer were prepared with the composition C1 which had a thermal conductivity of 16.0 W/(m*K) and this means the difference between TC1 and TC2 is zero. Consequently, the housing part made in the comparative example 2 showed lower mechanical strength as indicated as "serious cracked" in Table 1. Besides that, the surface quality of the housing part in comparative example 2 was poor.

The above are only preferred examples of the present invention, being not employed to limit the invention. For those skilled in the art, various modifications and variations can be made to the compositions and methods of the present invention without departing from the scope of the invention. With reference to the disclosure in the present description, those skilled in the art may also reach other examples. The present description and examples should be only regarded as illustrative, and the true scope of the present invention is defined by the appended claims and their equivalents.

The invention claimed is:

1. A housing part comprising
a first layer, said first layer being molded from a first composition comprising a1) 50-90 wt. % of a first amorphous polymer and b1) 10-50 wt. % of a first thermally conductive filler, the first composition having a thermal conductivity (TC1) of 4-40 W/(m*K),
a second layer, said second layer being molded from a second composition comprising a2) 50-90 wt. % of a second amorphous polymer and b2) 10-50 wt. % of a second thermally conductive filler, the second composition having a thermal conductivity (TC2) of 0.5-10 W/(m*K), and the second layer being molded over the first layer by leaving at least one area of the first layer not being over-molded with the second layer for being exposed to at least one heat source,
wherein, TC1 is at least 2 W/(m*K) larger than TC2, the amounts of a1 and b1 are based on the total weight of the first composition, the amounts of a2 and b2 are based on the total weight of the second composition, and the thermal conductivity is measured in-plane according to ASTM E1461-01.

2. The housing part as claimed in claim 1, wherein the first amorphous polymer and/or the second amorphous polymer is an aromatic polycarbonate.

3. The housing part as claimed in claim 1, wherein the first composition and/or the second composition comprises less than 5 wt. % of a semi-crystalline polymer or a crystalline polymer, based on the total weight of the first composition and/or the second composition respectively.

4. The housing part as claimed in claim 1, wherein at least 50 wt. % of b1) is selected from the group consisting of a silicon nitride, an aluminium nitride, a boron nitride, a graphite, a ceramic filler and any mixtures thereof, based on the total weight of b1).

5. The housing part as claimed in claim 1, wherein at least 50 wt. % of b2) is selected from the group consisting of a magnesium hydroxide, a talc, a boehmite aluminum hydroxide, a diaspore aluminum hydroxide, a gibbsite aluminum hydroxide, a calcium carbonate, a mica, a barium oxide, a barium sulfate, a calcium silicate, a zirconium oxide, a silicon oxide, a glass beads, a magnesium aluminum oxide, a calcium magnesium carbonate, a ceramic coated graphite, a clay, and any mixtures thereof.

6. The housing part as claimed in claim 1, wherein the area of the first layer not being over-molded with the second layer comprises at least one heat sink for being coupled with at least a heat source.

7. The housing part as claimed in claim 6, wherein the heat sink comprises at least one fin.

8. The housing part as claimed in claim 6, wherein the heat sink is coupled with the heat source through a thermal interface material.

9. A housing comprising the housing part as claimed in claim 1.

10. The housing in claim 9, wherein the housing further comprises a covering part coupled with the housing part for forming the housing, said covering part being made from a thermoplastic polymer.

11. An electronic device comprising the housing as claimed in claim 9, and further comprising at least one electronic component as the heat source mounted in the housing.

12. A process for preparing the housing part as claimed in claim 1, comprising the steps of:
molding the first layer with the first composition in a first mold cavity, and
molding the second layer with the second composition in a second mold cavity over the first layer by leaving at least one area of the first layer not being over-molded with the second layer for being exposed to at least one heat source.

\* \* \* \* \*